(12) United States Patent
Sugimoto et al.

(10) Patent No.: US 8,222,675 B2
(45) Date of Patent: Jul. 17, 2012

(54) NITRIDE SEMICONDUCTOR DEVICE INCLUDING GATE INSULATING PORTION CONTAINING AIN

(75) Inventors: Masahiro Sugimoto, Toyota (JP); Hiroyuki Ueda, Kasugai (JP); Tsutomu Uesugi, Seto (JP); Masakazu Kanechika, Aichi-ken (JP); Tetsu Kachi, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 206 days.

(21) Appl. No.: 12/544,451

(22) Filed: Aug. 20, 2009

(65) Prior Publication Data

US 2010/0044753 A1    Feb. 25, 2010

(30) Foreign Application Priority Data

Aug. 21, 2008    (JP) ................. 2008-213193

(51) Int. Cl.
*H01L 29/778* (2006.01)
(52) U.S. Cl. ........ 257/194; 257/189; 257/192; 257/200; 257/201; 257/629; 257/E29.246; 257/E21.407
(58) Field of Classification Search .......... 257/189, 257/192, 194, 200, 201, 629, E29.246, E21.407
See application file for complete search history.

(56) References Cited

U.S. PATENT DOCUMENTS

2007/0278507 A1    12/2007    Nakazawa et al.

FOREIGN PATENT DOCUMENTS

| JP | 63-237565 | 10/1988 |
|---|---|---|
| JP | 2005-527102 | 9/2005 |
| JP | 2007-227621 | 9/2007 |
| JP | 2007-250727 | 9/2007 |
| WO | WO 03/032397 | 4/2003 |

OTHER PUBLICATIONS

Jakiela et al., Si diffusion in epitaxial GaN, Phys. Stat. Sol. (c) 3, No. 6, 2006, p. 1417-1419.*
Aggarwal, R., et al., "Gate dielectric engineering of quarter sub micon AlGaN/GaN MISHFET: A new device architecture for improved transconductance and high cut-off frequency," Solid-State Electronics, vol. 52, (2008), pp. 1610-1614.

(Continued)

*Primary Examiner* — N Drew Richards
*Assistant Examiner* — John P Dulka
(74) *Attorney, Agent, or Firm* — Finnegan, Henderson, Farabow, Garrett & Dunner, LLP (57) ABSTRACT

A nitride semiconductor device 2 comprises a nitride semiconductor layer 10. A gate insulating film 16 is formed on the surface of the nitride semiconductor layer 10. The gate insulating film 16 includes a portion composed of an aluminum nitride film 15 and a portion composed of an insulating material 14 that contains at least one of oxygen or silicon. A region W2 of the nitride semiconductor layer 10 facing the aluminum nitride film 15 is included in a region W1 of the nitride semiconductor layer 10 facing a gate electrode 18. The nitride semiconductor device 2 may further comprise a nitride semiconductor lower layer 8. The nitride semiconductor layer 10 may be stacked on the surface of the nitride semiconductor lower layer 8. The nitride semiconductor layer 10 may have a larger band gap than that of the nitride semiconductor lower layer 8 and have a heterojunction formed there between.

12 Claims, 5 Drawing Sheets

OTHER PUBLICATIONS

Kao, C.J., et al., "Comparison of low-temperature GaN, $SiO_2$, and $SiN_x$ as gate insulators on AlGaN/GaN heterostructure field-effect transistors," Journal of Applied Physics, vol. 98, (2005), pp. 064506-064506-5.

Ren, F., et al., "Demonstration of GaN MIS Diodes by Using AlN and $Ga_2O_3(Gd_2O_3)$ as Dielectrics," Solid State Electronics, vol. 42, No. 12, (1998), pp. 2177-2181.

Sugimoto, M., et al., "Vertical device operation of AlGaN/GaN HEMTs on free-standing n-GaN substractes," Power Conversion Conference, (2007), pp. 368-372.

European Search Report for EP Application No. 09168410, dated Nov. 10, 1999.

Notification of Reasons for Rejection for JP Appl. No. 2008-213193 dated Jan. 18, 2011.

Office Action from the Japanese Patent Office for JP 2008-213193 dated Nov. 15, 2011.

* cited by examiner

NITRIDE SEMICONDUCTOR DEVICE INCLUDING GATE INSULATING PORTION CONTAINING AlN

BACKGROUND OF THE INVENTION

1. Field of the Invention

The present invention relates to a nitride semiconductor device.

2. Description of the Related Art

A nitride semiconductor device has been developed. The nitride semiconductor device is generally provided with a nitride semiconductor layer made of nitride based compound, a gate insulating film covering the surface of the nitride semiconductor layer, and a gate electrode disposed on the surface of the gate insulating film.

In the nitride semiconductor device provided with the gate electrode, it is preferable that the nitride semiconductor device has characteristics in which current does not flow through the nitride semiconductor layer in a region facing the gate electrode when a positive voltage is not applied to the gate electrode, whereas the current flows through the nitride semiconductor layer in the region facing the gate electrode when a positive voltage is applied to the gate electrode. Hereinafter, such characteristics will be referred to as normally-off characteristics. On the other hand, characteristics in which the current flows through the nitride semiconductor layer in the region facing the gate electrode even when a gate voltage of 0 volt is applied to the gate electrode, whereas the current does not flow through the nitride semiconductor layer in the region facing the gate electrode when a negative gate voltage below a threshold voltage is applied to the gate electrode will be referred to as normally-on characteristics. In general, it has been considered that normally-off semiconductor devices are easier to use than normally-on semiconductor devices.

As an example of nitride semiconductor devices, a semiconductor device having an insulated gate high electron mobility transistor (HEMT) structure is known. The insulated gate HEMT composed of nitride semiconductor is provided with a nitride semiconductor lower layer, a nitride semiconductor layer stacked on the surface of the nitride semiconductor lower layer, a gate insulating film covering the surface of the nitride semiconductor layer, and a gate electrode disposed on the surface of the gate insulating film. The band gap of the nitride semiconductor layer and the band gap of the nitride semiconductor lower layer are different from each other, and the nitride semiconductor layer is interfaced with the nitride semiconductor lower layer with a heterojunction. On the surface of the nitride semiconductor layer, a pair of electrodes is disposed with an interval therebetween, and the surface of a portion of the nitride semiconductor layer located in the interval between the pair of electrodes is covered with the gate insulating film. Moreover, the gate electrode is disposed in the interval between the pair of electrodes.

When the nitride semiconductor layers of different band gaps are layered with each other with heterojunction therebetween, a two-dimensional electron gas layer (2DEG layer) is formed at the heterojunction interface and thus allowing the current flow thereof. A normal HEMT has the normally-on characteristics in which current flows even when a positive gate voltage is not applied to the gate electrode and the current does not flow when a negative gate voltage below a threshold voltage is applied to the gate electrode.

In a HEMT in which nitride semiconductor layers of different band gaps interfaced with a heterojunction between each other, when the impurity concentration of the nitride semiconductor layer on the upper surface side is lowered and its thickness is made small, a phenomenon in which the 2DEG layer is not formed at the heterojunction interface under normal condition, but is formed by applying a gate voltage to the gate electrode can be obtained. By adjusting the impurity concentration and thickness of the nitride semiconductor layer on the upper surface side, the normally-off characteristics can be developed.

Figure 4:
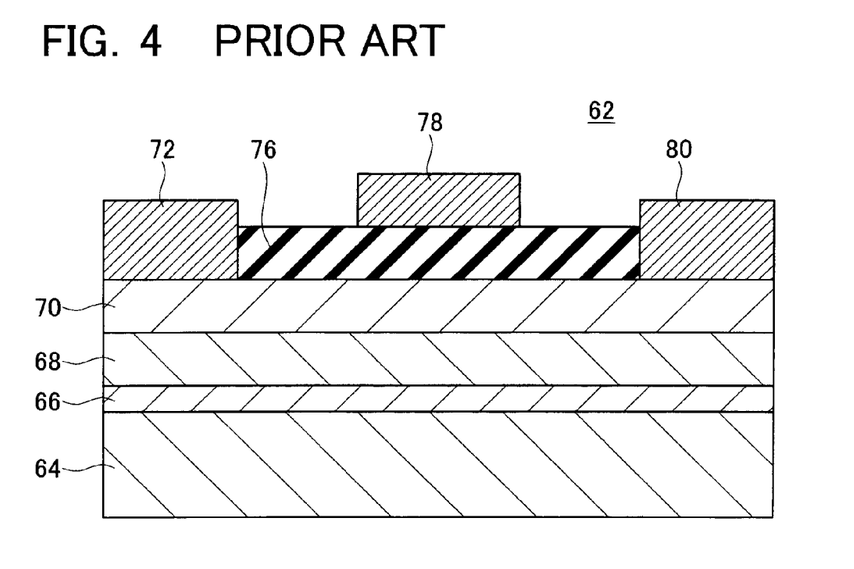
FIG. 4 is a cross-sectional view of a conventional nitride semiconductor device 62.

FIG. 4 shows a nitride semiconductor device 62 in related art. The nitride semiconductor device 62 is provided with a substrate 64, a buffer layer 66 stacked on the surface of the substrate 64, a nitride semiconductor lower layer 68 stacked on the surface of the buffer layer 66, and a nitride semiconductor layer 70 stacked on the surface of the nitride semiconductor lower layer 68. The nitride semiconductor layer 70 is composed of an AlGaN layer, the nitride semiconductor lower layer 68 is composed of a GaN layer, and a heterojunction is formed therebetween. The band gap of the nitride semiconductor layer 70 and the band gap of the nitride semiconductor lower layer 68 are different from each other.

On the surface of the nitride semiconductor layer 70, a pair of electrodes 72 and 80 is disposed. The pair of electrodes 72 and 80 is arranged with an interval therebetween, and the surface of a portion of the nitride semiconductor layer 70 which is located in the interval is covered with a gate insulating layer 76. The gate insulating layer 76 is composed of $SiO_2$. On a part of the surface of the gate insulating layer 76, a gate electrode 78 is disposed.

When the impurity concentration and thickness of the nitride semiconductor layer 70 are adjusted, a relationship can be obtained in which the 2DEG layer is not formed at the heterojunction interface between the nitride semiconductor layer 70 and the nitride semiconductor lower layer 68 when a positive gate voltage is not applied to the gate electrode 78, and the 2DEG layer is formed at the heterojunction interface when a positive gate voltage is applied to the gate electrode 78. In fact, the structure shown in FIG. 4 theoretically has a high resistance between the pair of electrodes 72 and 80 while a positive gate voltage is not applied to the gate electrode 78.

BRIEF SUMMARY OF THE INVENTION

When manufacturing the nitride semiconductor device 62 for a purpose of actual use, a thermal treatment is carried out subsequent to manufacturing the aforestated structure shown in FIG. 4. When the thermal treatment is carried out, the resistance between the pair of electrodes 72 and 80 is lessened under a condition in which the gate voltage is not applied to the gate electrode 78. Even though the impurity concentration and thickness of the nitride based compound of the nitride semiconductor layer 70 are adjusted so as to attribute the normally-off characteristics to the nitride semiconductor device 62, after the semiconductor device 62 is completed by performing the thermal treatment, the attributed normally-off characteristics is no longer obtainable.

Similar to the foregoing case exemplifying the realization of the HEMT structure with nitride semiconductor, a similar problem occurs also in the case of realizing a metal-oxide-semiconductor (MOS) with nitride semiconductor. That is, MOS structure with nitride semiconductor comprises a pair of high impurity concentration regions including high concentration of n-type impurity within a semiconductor layer of p-type nitride based compound. The pair of high impurity concentration regions is spaced apart from each other. The surface of a portion of the p-type nitride semiconductor layer located in the interval between the pair of high impurity concentration regions is covered with a gate insulating film, and a gate electrode is disposed on the surface of the gate insulating film. In this case, n-p-n structure yielding the normally-off characteristics is supposedly obtained. However, when the semiconductor device in MOS structure is completed with thermal treatment, the normally-off characteristics thus obtained may change to the normally-on characteristics.

The present specification describes a semiconductor device which retains the normally-off characteristics even when the semiconductor device is completed with thermal treatment. The technology described in the present specification has been obtained through investigating the causes of the change of characteristics of the semiconductor device: from having the normally-off characteristics before thermal treatment to be attributed with the normally-on characteristics after the thermal treatment.

As a result of giving consideration to various causes, it has been found that, after thermal treatment, forming substance of the gate insulating film abutting on the nitride semiconductor layer is diffused therefrom to the nitride semiconductor layer, and thus affecting the impurity concentration of the nitride semiconductor layer. This occurrence results in the change of characteristics from being the normally-off to becoming the normally-on. More specifically, $SiO_2$ or SiN is typically used for the gate insulating film. With the thermal treatment, silicon is diffused into the nitride semiconductor layer. Silicon is an n-type impurity with respect to the nitride based compound of the semiconductor layer, and as such, the n-type impurity concentration of the nitride semiconductor layer is increased by the diffusion of the silicon. When the gate insulating film is composed of $SiO_2$, oxygen is also diffused into the nitride semiconductor layer. Oxygen is also a n-type impurity with respect to the nitride based compound of the semiconductor layer and as such, the n-type impurity concentration of the nitride semiconductor layer is increased by the diffusion of oxygen. Most of the materials available for the gate insulating film contain at least one of silicon and oxygen. Accordingly, the n-type impurity concentration of the nitride semiconductor layer may be changed by the thermal treatment. The generally employed gate insulating film is in most cases made with, for example, a $SiO_2$ film, a SiN film, a hafnium oxide (HfO) film and the like, and contains at least one of oxygen and silicon. An insulating film made of substances other than aluminum nitride (AlN) contains oxygen and/or silicon.

Figure 5:
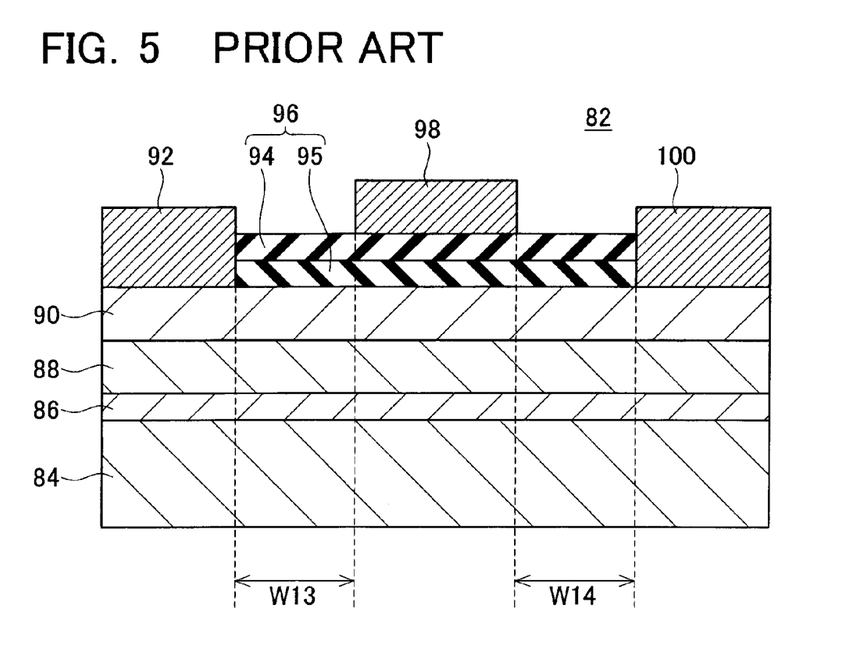
FIG. 5 is a cross-sectional view of another conventional nitride semiconductor device 82.

The inventors of the present teachings endeavored to configure the gate insulating film with AlN and $SiO_2$ in a stacked structure. FIG. 5 shows such semiconductor device configuration, in which a gate insulating film 96 is formed of layered AlN film 95 and $SiO_2$ film 94. In FIG. 5, elements each having a reference number in which the reference number shown in FIG. 4 is increased with an addition of 20 correspond to those described in FIG. 4 (for example, the electrodes 72 and 80 in FIG. 4 respectively correspond to electrodes 92, 100 of FIG. 5). Therefore, descriptions thereof will be omitted.

In the semiconductor device shown in FIG. 5, the AlN film 95 is formed between a nitride semiconductor layer 90 and the $SiO_2$ film 94. The silicon and oxygen that has diffused from the gate insulating film 94 by the thermal treatment are accumulated in the AlN film 95. Since activation rates of silicon and oxygen in the AlN film 95 are very small, the AlN film 95 maintains high resistance. Accordingly, the AlN film 95 serves as a diffusion barrier layer against silicon and oxygen. When the AlN film 95 is formed between the nitride semiconductor layer 90 and the $SiO_2$ film 94, characteristic change of the semiconductor device induced by thermal treatment can be prevented.

However, through the examinations performed, it became apparent that the semiconductor device having the structure shown in FIG. 5 cannot be turned on. In order to obtain the normally-off characteristics in the configuration as shown in FIG. 5, the impurity concentration and thickness of the nitride semiconductor layer 90 are adjusted such that the 2DEG layer at the heterojunction interface between the nitride semiconductor layer 90 composed of AlGaN and a nitride semiconductor lower layer 88 composed of GaN is not formed unless a gate voltage is applied to the gate electrode 98. In the case shown in FIG. 5, since the AlN layer 95 is formed, the normally-on characteristics is not changed by the thermal treatment. However, in regions represented by W13 and W14, the 2DEG layer is not formed even when the gate voltage is applied to the gate electrode 98. When the AlN layer 95 is used for the gate insulation film of the normally-off semiconductor device, while the change in the characteristics by the thermal treatment can be prevented, a problem in which the device cannot be turned on arises.

Figure 6:
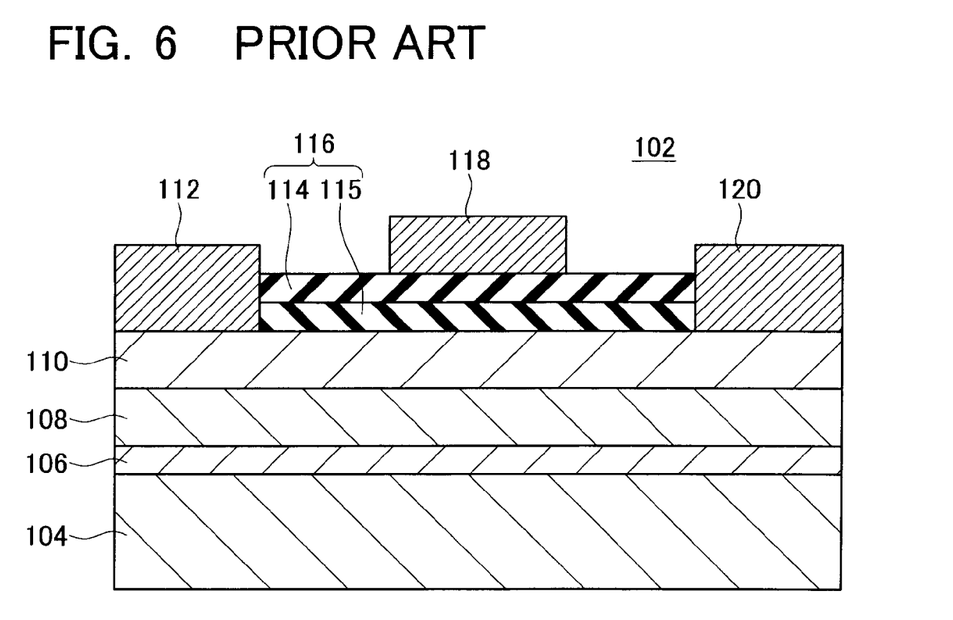
FIG. 6 is a cross-sectional view of yet another conventional nitride semiconductor device 102.

FIG. 6 shows a semiconductor device described in Japanese Patent Application Publication No. 2000-252458. In FIG. 6, elements each having a reference number in which the reference number shown in FIG. 4 is incremented by 40 correspond to those described in FIG. 4, and descriptions thereof will be omitted.

In the semiconductor device 102 shown in FIG. 6, a nitride semiconductor lower layer 108 is composed of n-type AlGaN, and a nitride semiconductor layer 110 is composed of n-type GaN. Since the nitride semiconductor lower layer 108 and the nitride semiconductor layer 110 formed are n-type, the semiconductor device 102 has the normally-on characteristics. By applying a negative voltage to a gate electrode 118, the device 102 can be switched to the state in which the current does not flow between a pair of electrodes 112 and 120.

In the semiconductor device 102 shown in FIG. 6, there is no need to prevent n-type impurities from diffusing from a $SiO_2$ film 114 into the nitride semiconductor layer 110. An AlN film 115 is used for its high breakdown voltage, not for the purpose of preventing diffusion.

In the semiconductor device 102 shown in FIG. 6, since the n-type nitride based compound is used in the semiconductor layer 110, the AlN film 115 can consequently be used for the gate insulating film 116. When the structure to achieve the normally-off characteristics is realized, however, since electrons are not generated between the pair of electrodes 112 and 120 and the gate electrode 118 even when a positive gate voltage is applied to the gate electrode 118, the semiconductor device 102 is not turned on even when the gate voltage is applied to the gate electrode 118.

The semiconductor device 102 shown in FIG. 6 uses the nitride semiconductor lower layer 108 of n-type AlGaN and the nitride semiconductor layer 110 of n-type GaN, and has the normally-on characteristics. Accordingly, the semiconductor device 102 can be operated properly even when the AlN film 115 is used for the gate insulating film.

When the structure to achieve the normally-off characteristics is realized, however, by the same reason as described with reference to FIG. 5, the semiconductor device 102 is not turned on even when the gate voltage is applied to the gate electrode 118 as described above. It is because, when a gate-on voltage is applied to the gate electrode 118, the 2DEG layer is only formed at the heterojunction interface in the region facing the gate electrode 118, but not in the regions not facing the gate electrode 118 which correspond to W13 and W14 shown in FIG. 5 (i.e., it is because that the impurity concentration and thickness of the nitride semiconductor layer 110 are adjusted such that the 2DEG layer is not formed in order to achieve the normally-off characteristics).

Summarizing the foregoing, it can be described as follows:
(1) By adjusting the impurity concentration and thickness of the nitride semiconductor layer including nitride based compound, the normally-off characteristics can be obtained before the thermal treatment.
(2) However, if the semiconductor device is thermally treated, the characteristics of the semiconductor device may change from the normally-off characteristics to the normally-on characteristics.
(3) Forming the gate insulating film which contacts with the surface of the nitride semiconductor layer with AlN can prevent the occurrence of phenomenon in which the characteristics of the semiconductor device changes from the normally-off characteristics to the normally-on characteristics by the thermal treatment.
(4) However, when the gate insulating film which contacts with the surface of the nitride semiconductor layer is formed with AlN, since a diffusion layer of silicon or oxygen is not formed in the region of the nitride semiconductor layer which does not face the gate electrode, the semiconductor device is not turned on even when the gate-on voltage is applied to the gate electrode.

The teachings described in the present specification provides a technology to solve the above discussed problems. A semiconductor device described in the present specification includes a nitride semiconductor layer, a gate insulating film covering the surface of the nitride semiconductor layer, and a gate electrode disposed on the surface of the gate insulating film.

The gate insulating film includes a portion composed of aluminum nitride and a portion composed of insulating material that contains at least one of oxygen and silicon. Here, a region of the nitride semiconductor layer facing the gate electrode is defined as a first region, and a region of the nitride semiconductor layer facing the gate electrode and the portion of the gate insulating film composed of aluminum nitride is defined as the second region. According to this configuration, a relationship in which the first region includes the second region is established. In other words, the second region is equal to or smaller than the first region.

In the semiconductor device described in the present specification, the surface of the second region making contact with the gate insulating film and the area within the second region in the vicinity of the surface of the second region are i-type or p-type. Furthermore, while on the other hand, the surface of the nitride semiconductor layer, except for the second region, making contact with the gate insulating film and the area within the nitride semiconductor layer, other than the second region, are n-type.

The nitride semiconductor device may be of vertical type or horizontal type.

When the semiconductor device described in the present specification is a normally-off HEMT, the semiconductor device may further include a nitride semiconductor lower layer that is interfaced with the nitride semiconductor layer with a heterojunction therebetween. The band gap of the nitride based compound composing the nitride semiconductor layer is different from the band gap of the nitride based compound composing the nitride semiconductor lower layer.

When the semiconductor device described in the present specification is a normally-off HEMT, the impurity concentration and thickness of the nitride semiconductor layer may be adjusted such that a two-dimensional electron gas layer (2DEG layer) is not formed at the heterojunction interface between the nitride semiconductor layer and the nitride semiconductor lower layer unless a positive gate voltage is applied to the gate electrode.

Even though the semiconductor device may be adjusted to such condition, when thermal treatment is normally carried out, the normally-off characteristics are lost since oxygen or silicon is diffused from the gate insulating film to the nitride semiconductor layer. This phenomenon has been described in the foregoing with reference to FIG. 4. While this problem can be resolved by using aluminum nitride for the gate insulating film, the semiconductor device is not turned on even when a voltage is applied to the gate electrode. This phenomenon has been described in the foregoing with reference to FIG. 5. When aluminum nitride is to be used for the gate insulating film, as shown in FIG. 6, the semiconductor device must have the normally-on characteristics.

The semiconductor device described in the present specification resolves the various aforementioned problems by employing a relationship in which the region of the nitride semiconductor layer facing the gate electrode includes a region further facing the aluminum nitride.

More specifically, since aluminum nitride is formed in the region facing the gate electrode, the region of the nitride semiconductor facing the gate electrode is not entirely changed to n-type, and the region of the nitride semiconductor facing the aluminum nitride remains as i-type. Consequently, the normally-off characteristics are retained.

On the contrary, as the aluminum nitride is not formed to correspond to regions other than the region facing the gate electrode, at least one of oxygen or silicon is diffused from the gate insulating film to the nitride semiconductor by thermal treatment, and the nitride semiconductor within such range is changed to n-type. In the regions other than the region facing the gate electrode, the two-dimensional electron gas layer cannot be induced even when a voltage is applied to the gate electrode. However, as the region other than the region where the gate electrode is disposed is changed to n-type already in the semiconductor device described in the present specification, the semiconductor device can be turned on.

In the semiconductor device described in the present specification, the region facing the aluminum nitride may be equal to or smaller than the region facing the gate electrode. When the region facing the aluminum nitride is smaller than the region facing the gate electrode, the n-type converted region is formed in the region facing the gate electrode. However, as long as the i-type region remains in the region facing the gate electrode, a problem does not arise by forming the n-type converted region. Even when the n-type converted region is partially formed, as long as i-type region remains in the region facing the gate electrode, the normally-off characteristics can be retained.

In the semiconductor device described in the present specification, a pair of high impurity concentration regions including a high concentration of n-type impurity may be formed in the nitride semiconductor layer with an interval therebetween, and the gate insulating film may cover the surface of a portion of the nitride semiconductor layer which is located in the interval between the pair of high impurity concentration regions.

The nitride semiconductor device may be of vertical type or horizontal type.

The semiconductor device described in the present specification is not limited to HEMT, and may be MOS. In this case, as long as gallium nitride of i-type or p-type remains in the region facing the gate electrode after thermal treatment, the normally-off characteristics can be retained. For this purpose, the technique of forming aluminum nitride in the region facing the gate electrode according to the present teachings is advantageous. In the semiconductor device according to the present teachings which is embodied as the MOS, a nitride semiconductor layer of i-type or p-type remains in the region facing the gate electrode.

A pair of high impurity concentration regions may be arranged along the surface of the nitride semiconductor layer, or may be arranged in a depth direction of the nitride semiconductor layer. In the latter case, by forming trenches in the nitride semiconductor layer, the structure can be obtained in which the portion of the nitride semiconductor layer that is located in the interval between the pair of high impurity concentration regions is exposed on the walls of the trenches. Accordingly, the surfaces can be covered with the gate insulating film. In this case, by placing aluminum nitride in the region where the gate electrode is disposed, the normally-off characteristics can be retained. Further, the MOS which is turned on when a positive gate voltage is applied to the gate electrode can be provided. This nitride semiconductor device may also be of vertical type or horizontal type.

These aspects and features may be utilized singularly or, in combination, in order to make improved nitride semiconductor device. In addition, other objects, features and advantages of the present teachings will be readily understood after reading the following detailed description together with the accompanying drawings and claims. Of course, the additional features and aspects disclosed herein also may be utilized singularly or, in combination with the above-described aspect and features.

DETAILED DESCRIPTION OF THE EMBODIMENT

Preferred Features of an Embodiment of the Present Teachings

Here, the preferred features of the embodiment of the present teachings described below are listed as follows:
(1) General expression of a nitride based compound of the nitride semiconductor layer is $Al_XGa_YIn_{1-X-Y}N$, where $0 \leq X \leq 1$, $0 \leq Y \leq 1$, and $0 \leq 1-X-Y \leq 1$.
(2) An AlN film is formed with a thickness not reaching a gate electrode.
(3) The width of the AlN film is twice or more as large as the diffusing distance of silicon or oxygen in the nitride semiconductor layer.

Embodiment of the Present Teachings

First Embodiment

Figure 1:
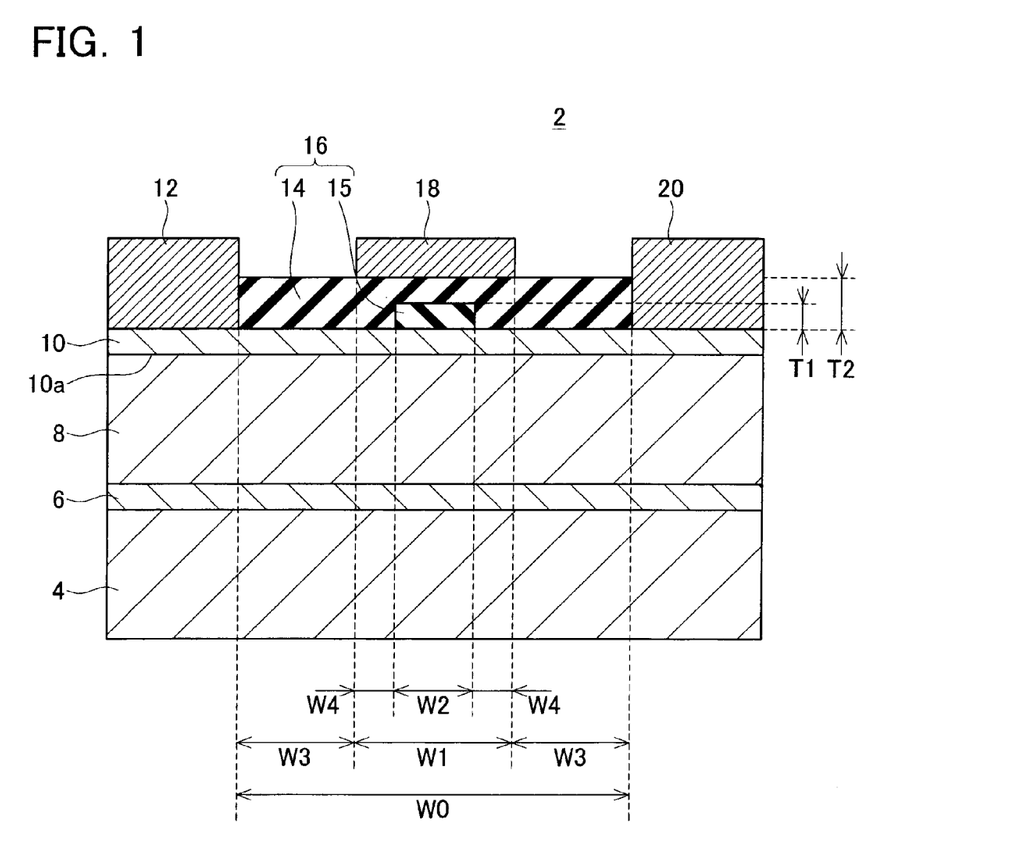
FIG. 1 is a cross-sectional view of a nitride semiconductor device 2 according to a first embodiment of the present teachings.

FIG. 1 is a cross-sectional view of a nitride semiconductor device 2 (which may also be referred to as a nitride based (compound) semiconductor device) according to a first embodiment of the present teachings. The nitride semiconductor device 2 is an n-channel horizontal semiconductor device having a HEMT structure. The nitride semiconductor device 2 has a sapphire substrate 4. On the surface of the sapphire substrate 4, a buffer layer 6 is stacked. The buffer layer 6 is composed of GaN. The buffer layer 6 has a thickness of 50 nm. On the surface of the buffer layer 6, a nitride semiconductor lower layer 8 is stacked. The nitride semiconductor lower layer 8 is composed of a nitride based compound; e.g. i-type GaN as in the present embodiment. As such the nitride semiconductor lower layer 8 may also be referred to as a nitride based (compound) semiconductor lower layer. The nitride semiconductor lower layer 8 has a thickness of 2 µm. On the surface of the nitride semiconductor lower layer 8, a nitride semiconductor layer 10 is stacked. The nitride semiconductor layer 10, which may also be referred to as nitride based (compound) semiconductor layer, is composed of another nitride based compound; e.g. i-type AlGaN. The nitride semiconductor layer 10 has a thickness of 5 nm. The nitride semiconductor layer 10 has a larger band gap than that of the nitride semiconductor lower layer 8. The nitride semiconductor layer 10 and the nitride semiconductor lower layer 8 are layered with a heterojunction therebetween.

On a part of the surface of the nitride semiconductor layer 10, a source electrode 12 and a drain electrode 20 are disposed. The source electrode 12 and the drain electrode 20 are disposed with an interval W0 therebetween. The surface of a portion of the nitride semiconductor layer 10 located in the interval W0 is covered with a gate insulating film 16. The gate insulating film 16 is composed of a $SiO_2$ film 14 and an AlN film 15. On the surface of the gate insulating film 16, a gate electrode 18 is disposed.

Defining a first region W1 as the region facing the gate electrode 18, and a second region W2 as the region facing the AlN film 15, the first region W1 includes the second region W2. The AlN film 15 has a film thickness T1 of 10 nm and the gate insulating film 16 has a thickness T2 of 50 nm. It may also be said that the AlN film 15, except for the surface that is in contact with the nitride semiconductor layer 10, is surrounded by the $SiO_2$ film 14 both in the width direction and the thickness direction.

The gate insulating film 16 can be formed by a method described below.

First, on the entire surface of the nitride semiconductor layer 10, the AlN film 15 is formed using magnetron sputtering. Next, using photolithography and reactive ion etching (RIE), the AlN film 15 in the second region W2 is made to remain. Using chemical vapor deposition (CVD) on the surface of the AlN film 15 and the surface of the nitride semiconductor layer 10, the $SiO_2$ film 14 is then formed. The nitride semiconductor device 2, subsequent to manufacturing the structure shown in FIG. 1, is completed by thermal treatment. By the thermal treatment, oxygen and silicon are diffused from the $SiO_2$ film 14 towards the nitride semiconductor layer 10. However, since the AlN film 15 serves as a diffusion barrier layer against such diffusing oxygen and silicon, the oxygen and silicon are not diffused to the nitride semiconductor layer 10 in the second region W2. After the thermal treatment, the nitride semiconductor device 2 has oxygen and silicon diffused from the $SiO_2$ film 14 into the nitride semiconductor layer 10 in the region other than the second region W2 where the AlN film 15 is formed. The nitride semiconductor layer 10 in the region other than the second region W2 is changed to n-type.

The nitride semiconductor layer 10 of the nitride semiconductor device 2 in the second region W2 remains as i-type even after the thermal treatment and, as long as a positive voltage is not applied to the gate electrode 18, the current does not flow through the nitride semiconductor layer 10 in the second region W2. Even when a voltage is applied between the source electrode 12 and the drain electrode 20, as long as a positive voltage is not applied to the gate electrode 18, the current does not flow between the source electrode 12 and the drain electrode 20. The nitride semiconductor device 2 retains the normally-off characteristics.

A region W3 where the gate electrode 18 does not face in the interval W0 between the source electrode 12 and the drain electrode 20 is not affected by the gate voltage even when the gate voltage is applied to the gate electrode 18. If the nitride semiconductor layer 10 in the region W3 is i-type, the nitride semiconductor device 2 is not turned on even when a voltage is applied to the gate electrode 18. In the nitride semiconductor device 2, as the nitride semiconductor layer 10 is changed to n-type except for the second region W2, the nitride semiconductor layer 10 in the region W3 is naturally changed to n-type. When a voltage is applied to the gate electrode 18, the nitride semiconductor device 2 is turned on.

In a region W4, which faces the gate electrode 18 but the AlN film 15 and the gate electrode 18 are not facing each other within the first region WI, the nitride semiconductor layer 10 is changed to n-type. However, the nitride semiconductor layer 10 in the region W4 being changed to n-type interferes neither the nitride semiconductor device 2 to retain the normally-off characteristics nor the nitride semiconductor device 2 to be turned on.

Next, the operation of the nitride semiconductor device 2 will be described. The nitride semiconductor device 2 is used by applying a voltage between the source electrode 12 and the drain electrode 20. When a positive voltage is not applied to the gate electrode 18, at a portion of a heterojunction interface 10a located below the AlN film 15, 2DEG is not formed. Accordingly, the nitride semiconductor device 2 remains to be off. When a positive voltage is applied to the gate electrode, the 2DEG is formed at the portion of the heterojunction interface 10a located below the aluminum nitride film 15. In the regions of the nitride semiconductor layer 10 in the regions W3 and W4, since oxygen and silicon are diffused therein, an n-type conductive region is formed, so the 2DEG is formed at all times. As a consequence, the nitride semiconductor device 2 is turned on. In the nitride semiconductor device 2, electrons are moved utilizing the 2DEG. As the mobility of electrons is high, fast operation can thereby be realized.

In the nitride semiconductor device 2, it is preferable that the general expression of the nitride based compounds of the nitride semiconductor lower layer 8 and the nitride semiconductor layer 10 be $Al_XGa_YIn_{1-X-Y}N$, where $0 \leq X \leq 1$, $0 \leq Y \leq 1$, and $0 \leq 1-X-Y \leq 1$. It is required that the nitride semiconductor lower layer 8 and the nitride semiconductor layer 10 are of different band gaps from each other, and the heterojunction interface 10a is formed between the nitride semiconductor lower layer 8 and the nitride semiconductor layer 10.

Second Embodiment

Figure 2:
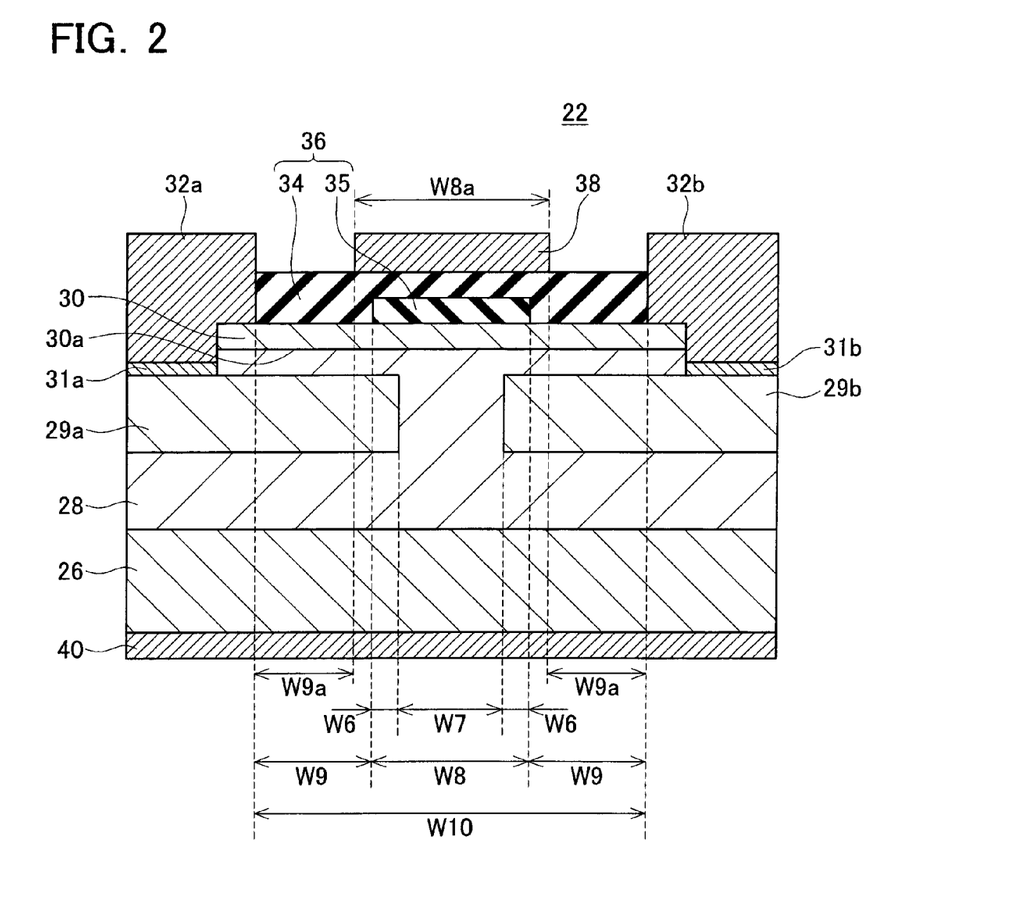
FIG. 2 is a cross-sectional view of a nitride semiconductor device 22 according to a second embodiment of the present teachings.

FIG. 2 is a cross-sectional view of a nitride semiconductor device 22 according to a second embodiment of the present teachings. The nitride semiconductor device 22 is an n-channel vertical semiconductor device having a HEMT structure. A drain electrode 40 is disposed on the bottom side of the device 22, a pair of source electrodes 32a and 32b is disposed on the surface side (i.e. the upper side) of the device 22, and the current flows in a vertical direction.

On the upper surface of the drain electrode 40, a nitride semiconductor substrate 26 composed of a single crystal nitride based compound is stacked. The nitride semiconductor substrate 26, which may also be referred to as a single crystal nitride based compound semiconductor substrate, is composed of n-type GaN. The nitride semiconductor substrate 26 has a thickness of 300 µm. On the surface of the nitride semiconductor substrate 26, a nitride semiconductor lower layer 28 is stacked. The nitride semiconductor lower layer 28 is composed of n-type GaN. The nitride semiconductor lower layer 28 has a thickness of 5 µm. In the vicinity of the surface of the nitride semiconductor lower layer 28, a pair of p-type GaN layers 29a and 29b is embedded. The pair of p-type GaN layers 29a and 29b is separated in the horizontal direction by an interval W7. The surfaces of the pair of p-type GaN layers 29a and 29b in both the vertical and horizontal direction are, with a partial exception (which will be described later in detail), covered with the nitride semiconductor lower layer 28. On the surface of the nitride semiconductor lower layer 28, a nitride semiconductor layer 30 is stacked. The nitride semiconductor layer 30 is composed of i-type AlGaN. The nitride semiconductor layer 30 has a thickness of 5 nm. The nitride semiconductor layer 30 has a larger band gap than that of the nitride semiconductor lower layer 28. The nitride semiconductor layer 30 and the nitride semiconductor lower layer 28 are interfaced at a heterojunction formed therebetween. Above one part of the i-type AlGaN layer 30, a source electrode 32a is disposed and, above another part of the i-type AlGaN layer 30, a source electrode 32b is disposed. The source electrodes 32a and 32b are electrically coupled with the nitride based compound semiconductor lower layer 28 and the i-type AlGaN layer 30.

Above the p-type GaN layer 29a at the aforesaid surface portion that is not surrounded by the nitride semiconductor lower layer 28, a body electrode 31a is disposed and, above the p-type GaN layer 29b also at the aforesaid surface portion that is not surrounded by the nitride semiconductor lower layer 28, a body electrode 31b is disposed. The body electrodes 31a and 31b are electrically coupled with the nitride semiconductor lower layer 28, the nitride semiconductor layer 30, and the p-type GaN layers 29a and 29b.

The surface of the portion of the nitride semiconductor layer 30 which is located within the interval region W10 between the pair of source electrodes 32a and 32b is covered with a gate insulating film 36. The gate insulating film 36 is composed of a $SiO_2$ film 34 and an AlN film 35. On the surface of the gate insulating film 36, a gate electrode 38 is disposed.

The first region W8a facing the gate electrode 38 and the second region W8 facing the AlN film 35 are larger than an interval region W7 between the pair of p-type GaN layers 29a and 29b, and extend in the horizontal direction while including the region W7.

The AlN film 35 has a thickness of 10 nm, and the gate insulating film 36 has a thickness of 50 nm. Similar to the configuration in the first embodiment, the AlN film 35 is surrounded by the $SiO_2$ film 34 and does not make contact with the gate electrode 38.

The gate insulating film 36 can be formed with a method described below.

First, on the entire surface of the nitride semiconductor layer 30, the AlN film 35 is formed using magnetron sputtering. Next, using photolithography and RIE, the AlN film 35 in the second region W8 is made to remain. Then by using CVD on the surface of the AlN film 35 and the surface of the nitride semiconductor layer 30, the SiO$_2$ film 34 is then formed. The nitride semiconductor device 22, subsequent to manufacturing the structure shown in FIG. 2, is completed by thermal treatment. By the thermal treatment, oxygen and silicon are diffused from the SiO$_2$ film 34 towards the nitride semiconductor layer 30. However, since the AlN film 35 serves as a diffusion barrier layer against oxygen and silicon, the oxygen and silicon are not diffused to the nitride semiconductor layer 30. After the thermal treatment, the nitride semiconductor device 22 has oxygen and silicon diffused from the SiO$_2$ film 34 into the nitride semiconductor layer 30 in the region other than the second region W8 facing the AlN film 35. The nitride semiconductor layer 30 in the region other than the second region W8 is changed to n-type.

The nitride semiconductor layer 30 of the nitride semiconductor device 22 in the second region W8 remains as i-type even after the thermal treatment and, as long as a voltage is not applied to the gate electrode 38, the current does not flow from the pair of source electrodes 32a and 32b to a portion of the nitride semiconductor layer 30 which is located in the interval W7. In other words, since a portion of the nitride semiconductor layer 30 which is located in an interval region W6 shown in the drawing is i-type, even when a voltage is applied between the source electrodes 32a and 32b and the drain electrode 40, as long as a voltage is not applied to the gate electrode 38, the current does not flow between the source electrodes 32a and 32b and the drain electrode 40. The nitride semiconductor device 22 retains the normally-off characteristics.

A region W9a where the gate electrode 38 does not face in the interval W10 between the pair of source electrodes 32a and 32b is not affected by the gate voltage even when the gate voltage is applied to the gate electrode 38. If the nitride semiconductor layer 30 in the region W9a is i-type, the nitride semiconductor device 22 is not turned on even when a voltage is applied to the gate electrode 38. In the nitride semiconductor device 22, as the nitride semiconductor layer 30 is changed to n-type except for the second region W8, the nitride semiconductor layer 30 in the region W9 is naturally changed to n-type. When a voltage is applied to the gate electrode 38, the nitride semiconductor device 22 is turned on.

Next, the operation of the nitride semiconductor device 22 will be described. The nitride semiconductor device 22 is used by applying voltage between the source electrodes 32a and 32b and the drain electrode 40. When a positive voltage is not applied to the gate electrode 38, at a portion of a heterojunction interface 30a located in the region W7, the 2DEG is not formed. Accordingly, the nitride semiconductor device 22 remains to be off. When a positive voltage is applied to the gate electrode 38, the 2DEG is formed at the portion of the heterojunction interface 30a which is located in the region W7. Accordingly, the current flows from the pair of source electrodes 32a and 32b to the portion of the nitride semiconductor layer 30 located in the region W7. The current flown to the portion of the nitride semiconductor layer 30 which is located in the interval region W7 flows through a portion of the n-type GaN layer 28 which fills the interval region W7 between the pair of p-type GaN layers 29a and 29b to the drain electrode 40. The nitride semiconductor device 22 is turned on. In the nitride semiconductor device 22, electrons are moved utilizing the 2DEG As the mobility of electrons is high, fast operation can thereby be realized.

In the nitride semiconductor device 22, it is preferable that the general expression of the nitride based compounds of the nitride semiconductor lower layer 28 and the nitride semiconductor layer 30 be Al$_X$Ga$_Y$In$_{1-X-Y}$N, where $0 \leq X \leq 1$, $0 \leq Y \leq 1$, and $0 \leq 1-X-Y \leq 1$. It is required that the nitride semiconductor lower layer 28 and the nitride semiconductor layer 30 are of different band gaps from each other, and the heterojunction interface 30a is to be formed between the nitride semiconductor lower layer 28 and the nitride semiconductor layer 30.

Third Embodiment

Figure 3:
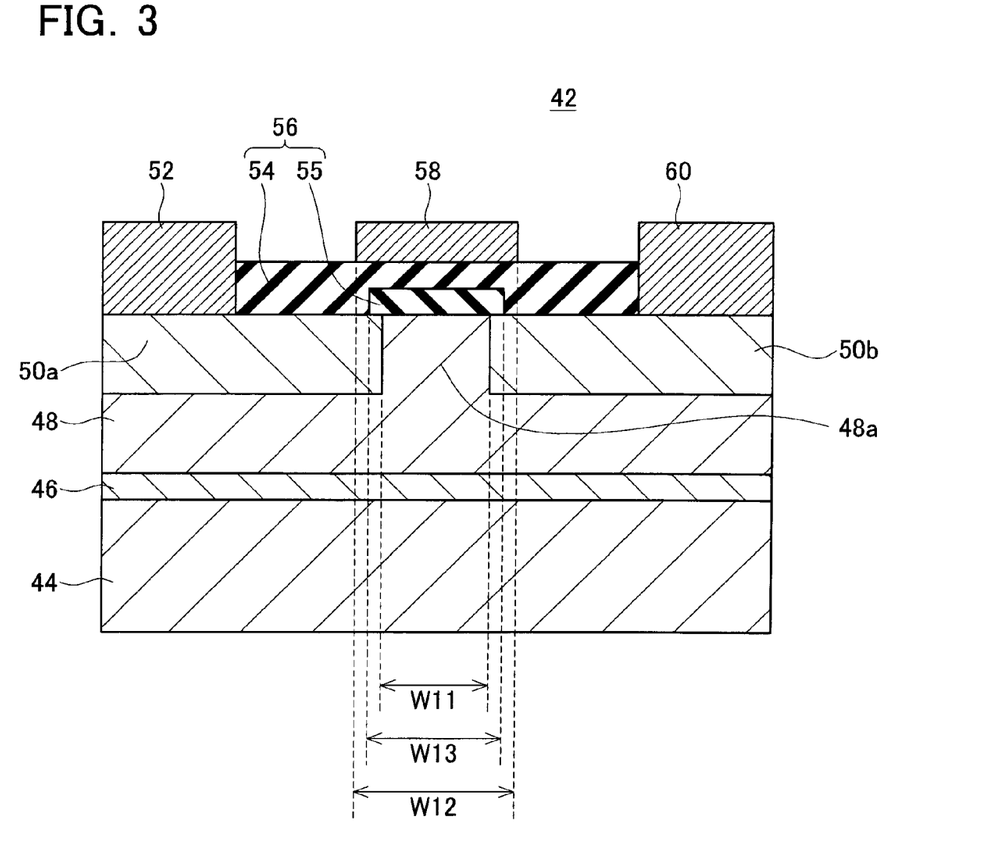
FIG. 3 is a cross-sectional view of a nitride semiconductor device 42 according to a third embodiment of the present teachings.

FIG. 3 is a cross-sectional view of a nitride semiconductor device 42 according to a third embodiment of the present teachings. The nitride semiconductor device 42 is an n-channel horizontal semiconductor device having a MOS structure.

The nitride semiconductor device 42 is provided with a sapphire substrate 44. On the surface of the sapphire substrate 44, a buffer layer 46 is formed. The buffer layer 46 is composed of GaN. On the surface of the buffer layer 46, a nitride semiconductor layer 48 is formed. The nitride semiconductor layer 48 is composed of p-type GaN. Within the surface of the nitride semiconductor layer 48, a protrusion portion 48a is formed. In the region on the surface of the nitride semiconductor layer 48 except for the region where the protrusion portion 48a is formed, high impurity concentration regions 50a and 50b are formed. The high impurity concentration regions 50a and 50b are composed of n$^+$-type GaN. The high impurity concentration regions 50a and 50b are formed by injecting Si into the relevant parts of the nitride semiconductor layer 48. Thus, the protrusion portion 48a of the nitride semiconductor layer 48 is surrounded by the high impurity concentration regions 50a and 50b.

On a part of the surface of the high impurity concentration region 50a, a source electrode 52 is disposed. On a part of the surface of the high impurity concentration region 50b, a drain electrode 60 is disposed. On the region of the surfaces of the high impurity concentration regions 50a and 50b where neither of the source electrode 52 nor the drain electrode 60 is disposed and on the surface of the protrusion portion 48a, a gate insulating film 56 is formed. On a part of the surface of the gate insulating film 56, a gate electrode 58 is disposed. The gate insulating film 56 is composed of a SiO$_2$ film 54 and an AlN film 55.

Defining a first region W12 as the region facing the gate electrode 58 and a second region W13 as the region facing the AlN film 55, the second region W13 is narrower than the first region W12, and an interval region W11 between the pair of high impurity concentration regions 50a and 50b (i.e. the region corresponding to the protrusion portion 48a) is narrower than the first region W12 and the second region W13.

The AlN film 55 and the SiO$_2$ film 54 can be formed in the same manner described in the first embodiment.

Next, the operation of the nitride semiconductor device 42 will be described. In the nitride semiconductor device 42, between the n-type region 50a electrically coupled with the source electrode 52 and the n-type region 50b electrically coupled with the drain electrode 60, the protrusion portion 48a of the p-type nitride semiconductor layer 48 is set in to configure an n-p-n transistor structure. Since the top surface of the protrusion portion 48a is covered with the AlN film 55, oxygen and silicon are not diffused from the SiO$_2$ film 54 to the protrusion portion 48a even when the nitride semiconductor device 42 is thermally treated. Consequently, even when the nitride semiconductor device 42 is thermally treated, the protrusion portion 48a remains in p-type, and thus the normally-off characteristics are retained therein.

When a positive voltage is applied to the gate electrode 58 while a voltage is applied between the source electrode 52 and the drain electrode 60, in the region of the nitride semiconductor layer 48 facing the gate electrode 58 (vicinity of the top surface of the protrusion portion 48a), an inversion layer can be formed. As a consequence, the current flows between the source electrode 52 and the drain electrode 60 in the nitride semiconductor device 42. The nitride semiconductor device 42 is thereby turned on.

In the nitride semiconductor devices 2, 22 and 42 according to the first, second and third embodiments, it is preferable that the AlN films 15, 35 and 55 be formed with a thickness not reaching the gate electrodes 18, 38 and 58, respectively. If the AlN films 15, 35 and 55 reach up to the gate electrodes 18, 38 and 58, when a positive voltage is applied to the gate electrodes 18, 38 and 58, a leak current may flow from the gate electrodes 18, 38 and 58 to the nitride semiconductor layers 10, 30 and 48 through the AlN films 15, 35 and 55. By covering the surfaces of the AlN films 15, 35 and 55 with the $SiO_2$ films 14, 34 and 54, the leak current can be prevented.

In the nitride semiconductor device 2 according to the present embodiment, it is preferable that the width W2 of the AlN film 15 be twice or more as large as the diffusion distance of silicon or oxygen in the nitride semiconductor layer 10. If the width of the AlN film 15 is smaller than twice the diffusion distance of silicon or oxygen, silicon or oxygen may be diffused into a portion of the nitride semiconductor layer 10 which is located below the AlN film 15. Consequently, a 2DEG layer may be stably formed at a portion of the heterojunction interface 10a which is located below the AlN film 15. In this case, the normally-off characteristics cannot be ensured. By making the width W2 of the AlN film 15 twice or more as large as the diffusion distance of silicon or oxygen in the nitride semiconductor layer 10, the normally-off characteristics can surely be ensured.

The same applies to the case shown in FIG. 2 and, by making the width W6 twice or more as large as the diffusion distance of silicon or oxygen in the nitride semiconductor layer 30, the normally-off characteristics can surely be ensured.

What is claimed is:

1. A semiconductor device comprising:
a nitride semiconductor layer;
a nitride semiconductor lower layer composed of nitride based compound;
a gate insulating film covering a surface of the nitride semiconductor layer;
a gate electrode disposed on a surface of the gate insulating film;
a first electrode disposed on a part of the surface of the nitride semiconductor layer; and
a second electrode disposed on another part of the surface of the nitride semiconductor layer, the second electrode being apart from the first electrode,
wherein the gate insulating film includes a portion composed of aluminum nitride and a portion composed of insulating material that contains at least one of oxygen and silicon,
the nitride semiconductor layer including a first region facing the gate electrode and being positioned directly below the gate electrode, and a second region facing the gate electrode and the portion of the gate insulating film composed of aluminum nitride, the second region being positioned directly below the portion composed of aluminum nitride, wherein the first region includes the second region and the second region is smaller in width than the first region,
a surface of the second region making contact with the gate insulating film and an area within the second region in the vicinity of the surface of the second region are i-type or p-type,
a surface of the nitride semiconductor layer except for the second region making contact with the gate insulating film and an area within the nitride semiconductor layer other than the second region are n-type,
wherein the nitride semiconductor layer and the nitride semiconductor lower layer are interfaced with a heterojunction,
a band gap of the nitride based compound of the nitride semiconductor layer is different from a band gap of the nitride based compound of the nitride semiconductor lower layer,
wherein the gate insulating film covers the surface of a portion of the nitride semiconductor layer located in the interval between the first and second electrodes,
the nitride semiconductor layer includes a third region facing the gate insulating film between the first and second electrodes, and the third region includes the first region, and
wherein the portion composed of aluminum nitride is formed with a thickness not reaching the gate electrode.

2. The semiconductor device according to claim 1, wherein the width of the portion of aluminum nitride is twice or more as large as the diffusing distance of silicon or oxygen in the nitride semiconductor layer.

3. A semiconductor device comprising:
a nitride semiconductor layer;
a nitride semiconductor lower layer composed of nitride based compound;
a gate insulating film covering a surface of the nitride semiconductor layer;
a gate electrode disposed on a surface of the gate insulating film;
a first electrode disposed on the bottom surface of the semiconductor device;
a pair of second electrodes disposed on the upper surface of the semiconductor device and being spaced from each other; and
a pair of p-type nitride semiconductor layer embedded in the vicinity of the surface of the nitride semiconductor lower layer,
wherein the gate insulating film includes a portion composed of aluminum nitride and a portion composed of insulating material that contains at least one of oxygen and silicon,
the nitride semiconductor layer including a first region facing the gate electrode and being positioned directly below the gate electrode, and a second region facing the gate electrode and the portion of the gate insulating film composed of aluminum nitride, the second region being positioned directly below the portion composed of aluminum nitride, wherein the first region includes the second region and the second region is smaller in width than the first region,
a surface of the second region making contact with the gate insulating film and an area within the second region in the vicinity of the surface of the second region are i-type or p-type,
a surface of the nitride semiconductor layer except for the second region making contact with the gate insulating film and an area within the nitride semiconductor layer other than the second region are n-type,
wherein the nitride semiconductor layer and the nitride semiconductor lower layer are interfaced with a heterojunction, a band gap of the nitride based compound of the nitride semiconductor layer is different from a band gap of the nitride based compound of the nitride semiconductor lower layer, wherein the pair of p-type nitride semiconductor layer is separated in the horizontal direction by an interval region, the surfaces of the pair of p-type nitride semiconductor layer in both the vertical and horizontal direction are covered with the nitride semiconductor lower layer, the gate insulating film is located between the pair of the second electrodes, each of the second electrodes is electrically coupled with the nitride semiconductor lower layer and the nitride semiconductor layer, and the second region is larger than the interval region between the pair of p-type nitride semiconductor layer, and extends in the horizontal direction while including the interval region.

4. The semiconductor device according to claim 3, wherein the portion composed of aluminum nitride is formed with a thickness not reaching the gate electrode.

5. The semiconductor device according to claim 4, wherein the width of the portion of aluminum nitride is twice or more as large as the diffusing distance of silicon or oxygen in the nitride semiconductor layer.

6. The semiconductor device according to claim 1, wherein
a pair of high impurity concentration regions including a high concentration of n-type impurity is formed in the nitride semiconductor layer,
the high impurity concentration regions of the pair are spaced apart with an interval, and
the gate insulating film covers the surface of the nitride semiconductor layer located in the interval between the pair of high impurity concentration regions.

7. The semiconductor device according to claim 6, wherein the width of the portion of aluminum nitride is twice or more as large as the diffusing distance of silicon or oxygen in the nitride semiconductor layer.

8. A semiconductor device comprising:
a nitride semiconductor layer;
a nitride semiconductor lower layer composed of nitride based compound;
a gate insulating film covering a surface of the nitride semiconductor layer;
a gate electrode disposed on a surface of the gate insulating film;
a first electrode disposed on the bottom surface of the semiconductor device;
a pair of second electrodes disposed on the upper surface of the semiconductor device and being spaced from each other; and
a pair of p-type nitride semiconductor layer embedded in the vicinity of the surface of the nitride semiconductor lower layer,
wherein the gate insulating film includes a portion composed of aluminum nitride and a portion composed of insulating material that contains at least one of oxygen and silicon,
the nitride semiconductor layer including a first region facing the gate electrode and being positioned directly below the gate electrode, and a second region facing the gate electrode and the portion of the gate insulating film composed of aluminum nitride, the second region being positioned directly below the portion composed of aluminum nitride, wherein the first region includes the second region and the second region is smaller in width than the first region, wherein the nitride semiconductor layer and the nitride semiconductor lower layer are interfaced with a heterojunction, a band gap of the nitride based compound of the nitride semiconductor layer is different from a band gap of the nitride based compound of the nitride semiconductor lower layer, wherein the pair of p-type nitride semiconductor layer is separated in the horizontal direction by an interval region, the surfaces of the pair of p-type nitride semiconductor layer in both the vertical and horizontal direction are covered with the nitride semiconductor lower layer, the gate insulating film is located between the pair of the second electrodes, each of the second electrodes is electrically coupled with the nitride semiconductor lower layer and the nitride semiconductor layer, and the second region is larger than the interval region between the pair of p-type nitride semiconductor layer, and extends in the horizontal direction while including the interval region.

9. The semiconductor device according to claim 8, wherein
a pair of high impurity concentration regions including a high concentration of n-type impurity is formed in the nitride semiconductor layer,
the high impurity concentration regions of the pair are spaced apart with an interval, and
the gate insulating film covers the surface of the nitride semiconductor layer located in the interval between the pair of high impurity concentration regions.

10. A semiconductor device comprising:
a nitride semiconductor layer;
a gate insulating film covering a surface of the nitride semiconductor layer; and
a gate electrode disposed on a surface of the gate insulating film,
wherein the gate insulating film includes a portion composed of aluminum nitride and a portion composed of insulating material that contains at least one of oxygen and silicon,
the nitride semiconductor layer including a first region facing the gate electrode and being positioned directly below the gate electrode, and a second region facing the gate electrode and the portion of the gate insulating film composed of aluminum nitride, the second region being positioned directly below the portion composed of aluminum nitride, wherein the first region includes the second region and the second region is smaller in width than the first region, and
the portion composed of aluminum nitride is formed with a thickness not reaching the gate electrode.

11. The semiconductor device according to claim 10, wherein the width of the portion of aluminum nitride is twice or more as large as the diffusing distance of silicon or oxygen in the nitride semiconductor layer.

12. The semiconductor device according to claim 11, wherein
a surface of the second region making contact with the gate insulating film and an area within the second region in the vicinity of the surface of the second region are i-type or p-type, and
a surface of the nitride semiconductor layer except for the second region making contact with the gate insulating film and an area within the nitride semiconductor layer other than the second region are n-type.

* * * * *